(12) United States Patent
Liu et al.

(10) Patent No.: US 10,096,663 B2
(45) Date of Patent: Oct. 9, 2018

(54) MANUFACTURING METHOD OF ARRAY SUBSTRATE, ARRAY SUBSTRATE AND DISPLAY DEVICE

(71) Applicant: BOE TECHNOLOGY GROUP CO., LTD., Beijing (CN)

(72) Inventors: Zheng Liu, Beijing (CN); Xiaoyong Lu, Beijing (CN); Xiaolong Li, Beijing (CN); Chien Hung Liu, Beijing (CN); Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 29 days.

(21) Appl. No.: 14/785,777

(22) PCT Filed: Mar. 12, 2015

(86) PCT No.: PCT/CN2015/074109
§ 371 (c)(1),
(2) Date: Oct. 20, 2015

(87) PCT Pub. No.: WO2016/065788
PCT Pub. Date: May 6, 2016

(65) Prior Publication Data
US 2016/0307978 A1    Oct. 20, 2016

(30) Foreign Application Priority Data

Oct. 31, 2014  (CN) .......................... 2014 1 0602733

(51) Int. Cl.
*H01L 27/12* (2006.01)
*H01L 27/32* (2006.01)
(Continued)

(52) U.S. Cl.
CPC ...... *H01L 27/3262* (2013.01); *H01L 27/3246* (2013.01); *H01L 51/5206* (2013.01);
(Continued)

(58) Field of Classification Search
CPC .......................... H01L 27/3262; H01L 27/3244
See application file for complete search history.

(56) References Cited

U.S. PATENT DOCUMENTS 7,626,330 B2   12/2009  Park et al.
8,796,768 B2   8/2014   You
(Continued)

FOREIGN PATENT DOCUMENTS

CN    1457220 A    11/2003
CN    1681365 A    10/2005
(Continued)

OTHER PUBLICATIONS

International Search Report of PCT/CN2015/074109 in Chinese, dated Aug. 5, 2015 with English translation.
(Continued)

*Primary Examiner* — Yu-Hsi D Sun
*Assistant Examiner* — Christina Sylvia
(74) *Attorney, Agent, or Firm* — Collard & Roe, P.C.

(57) ABSTRACT

A manufacturing method of an array substrate, an array substrate and a display device are provided. The manufacturing method of the array substrate comprises: forming a first conductive thin film (100) on a base substrate (1); and patterning the first conductive thin film (100), to form a pattern of a cathode (11) on a first region (11) of the base substrate (1), and form a pattern of a gate electrode (4) on a second region (12) of the base substrate (1). Complexity and process time of a fabrication process of an array substrate can be reduced, a fabrication process of an organic electroluminescent panel can be simplified, and production cost can be reduced, by forming a cathode layer of a light-emitting diode and a gate electrode layer of a thin film transistor in different regions of the base substrate at the same time by one patterning process.

20 Claims, 4 Drawing Sheets

(51) Int. Cl.
H01L 51/52 (2006.01)
H01L 51/56 (2006.01)

(52) U.S. Cl.
CPC .......... H01L 51/5221 (2013.01); H01L 51/56 (2013.01); *H01L 27/1274* (2013.01); *H01L 2227/323* (2013.01); *H01L 2251/558* (2013.01)

(56) References Cited

U.S. PATENT DOCUMENTS

| | | |
|---|---|---|
| 9,064,755 B2 | 6/2015 | Park et al. |
| 2005/0189874 A1 | 9/2005 | Park et al. |
| 2011/0114960 A1* | 5/2011 | Lee ............... H01L 27/3262 257/71 |
| 2012/0080663 A1 | 4/2012 | Lee et al. |
| 2013/0015456 A1* | 1/2013 | You ............... H01L 29/4908 257/71 |

FOREIGN PATENT DOCUMENTS

| | | |
|---|---|---|
| CN | 103107181 A | 5/2013 |
| CN | 104393017 A | 3/2015 |

OTHER PUBLICATIONS

Notice of Transmittal of the International Search Report of PCT/CN2015/074109 in Chinese, dated Aug. 5, 2015.

Written Opinion of the International Searching Authority of PCT/CN2015/074109 in Chinese, dated Aug. 5, 2015 with English translation.

Chinese Office Action in Chinese Application No. 201410602733.2, dated Sep. 26, 2016 with English translation.

Second Chinese Office Action in Chinese Application No. 201410602733.2, dated May 18, 2017 with English translation.

* cited by examiner

MANUFACTURING METHOD OF ARRAY SUBSTRATE, ARRAY SUBSTRATE AND DISPLAY DEVICE

CROSS REFERENCE TO RELATED APPLICATIONS

This application is the National Stage of PCT/CN2015/074109 filed on Mar. 12, 2015, which claims priority under 35 U.S.C. § 119 of Chinese Application No. 201410602733.2 filed on Oct. 31, 2014, the disclosure of which is incorporated by reference.

TECHNICAL FIELD

Embodiments of the invention relates to a manufacturing method of an array substrate, an array substrate and a display device.

BACKGROUND

An organic electroluminescent display panel is considered as having a great application prospect in panel display due to many advantages such as self-emitting, full solidity, wide viewing angle, fast response and so on, and is a new generation of panel display product after a Liquid Crystal Display (LCD) and a Plasma Display Panel (PDP).

A traditional organic electroluminescent display panel mainly includes two parts: an organic light-emitting diode (EL part) and a driving thin film transistor; with reference to FIG. 1, the driving thin film transistor mainly includes an active layer 2' formed on a base substrate 1', a gate insulating layer 3', a gate electrode 4', an intermediate insulating layer 5', a source-drain electrode 6' and a planarization layer 7'; the EL part mainly includes an anode layer 8', a pixel defining layer (PDL) 9', a cathode layer 11' and an organic light-emitting layer 10' between the anode layer 8' and the cathode layer 11', which are located above the planarization layer 7'. In a fabrication process of an organic electroluminescent display device, the above two parts are required to be formed by different fabrication processes, a process for fabricating an organic light-emitting diode of the EL part should be performed after a process of the driving thin film transistor is completed, and the fabrication processes of the two are complex, resulting in problems of excessive steps, long duration and high cost in the fabrication process of the organic electroluminescent display panel.

SUMMARY

According to an embodiment of the present invention, there is provided a manufacturing method of an array substrate, comprising:

forming a first conductive thin film on a base substrate; and patterning the first conductive thin film, to form a pattern of a cathode on a first region of the base substrate, and form a pattern of a gate electrode on a second region of the base substrate.

According to another embodiment of the present invention, there is provided an array substrate, comprising: a plurality of pixel units arranged in a matrix on a base substrate, each of the pixel units including a thin film transistor structure, a cathode, an anode and an organic light-emitting layer between the cathode and the anode, wherein, the cathode is formed on a first region of the base substrate, a gate electrode of the thin film transistor structure is formed on a second region of the base substrate, and the cathode and the gate electrode of the thin film transistor structure are made of a same material and formed by a one patterning process.

According to still another embodiment of the present invention, there is provided a display device, comprising the array substrate described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
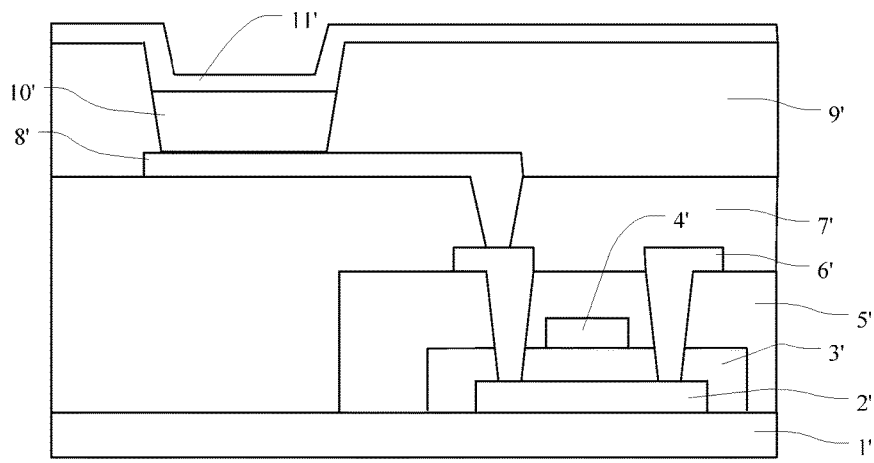
FIG. 1 is a structural schematic diagram of an organic electroluminescent panel in the prior art.
Figure 2:
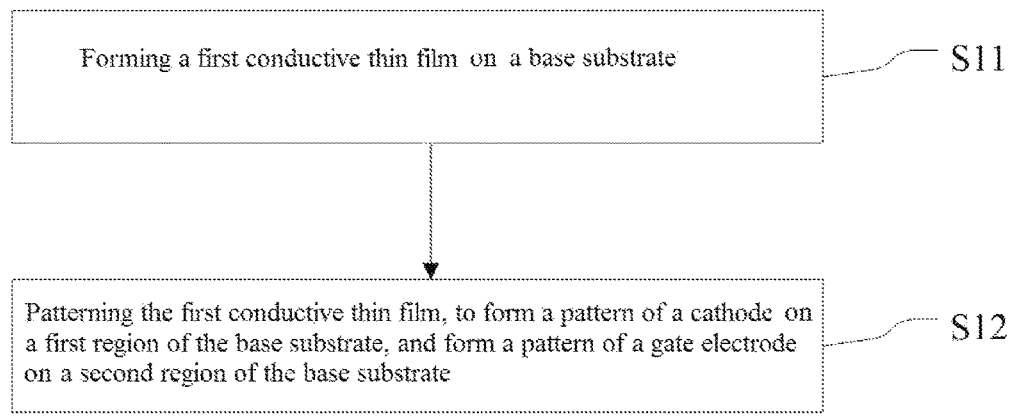
FIG. 2 is a flow chart of a manufacturing method of an array substrate provided by an embodiment of the present invention.

FIG. 2 is a flow chart of a manufacturing method of an array substrate provided by an embodiment of the present invention, and the manufacturing method of the array substrate comprises:

S11: forming a first conductive thin film on a base substrate; and

S12: patterning the first conductive thin film, to form a pattern of a cathode on a first region of the base substrate, and form a pattern of a gate electrode on a second region of the base substrate.

The first region of the base substrate is used for fabricating a light-emitting diode (EL part) in an organic electroluminescent panel, and the second region is used for fabricating a thin film transistor part of the organic electroluminescent panel.

The manufacturing method of the array substrate provided by the embodiment of the present invention, can reduce complexity and process time of a fabrication process of an array substrate, simplify a fabrication process of an organic electroluminescent panel, and reduce production cost, by forming a cathode layer of a light-emitting diode and a gate electrode layer of a thin film transistor in different regions of the base substrate at the same time by one patterning process.

Figure 3:
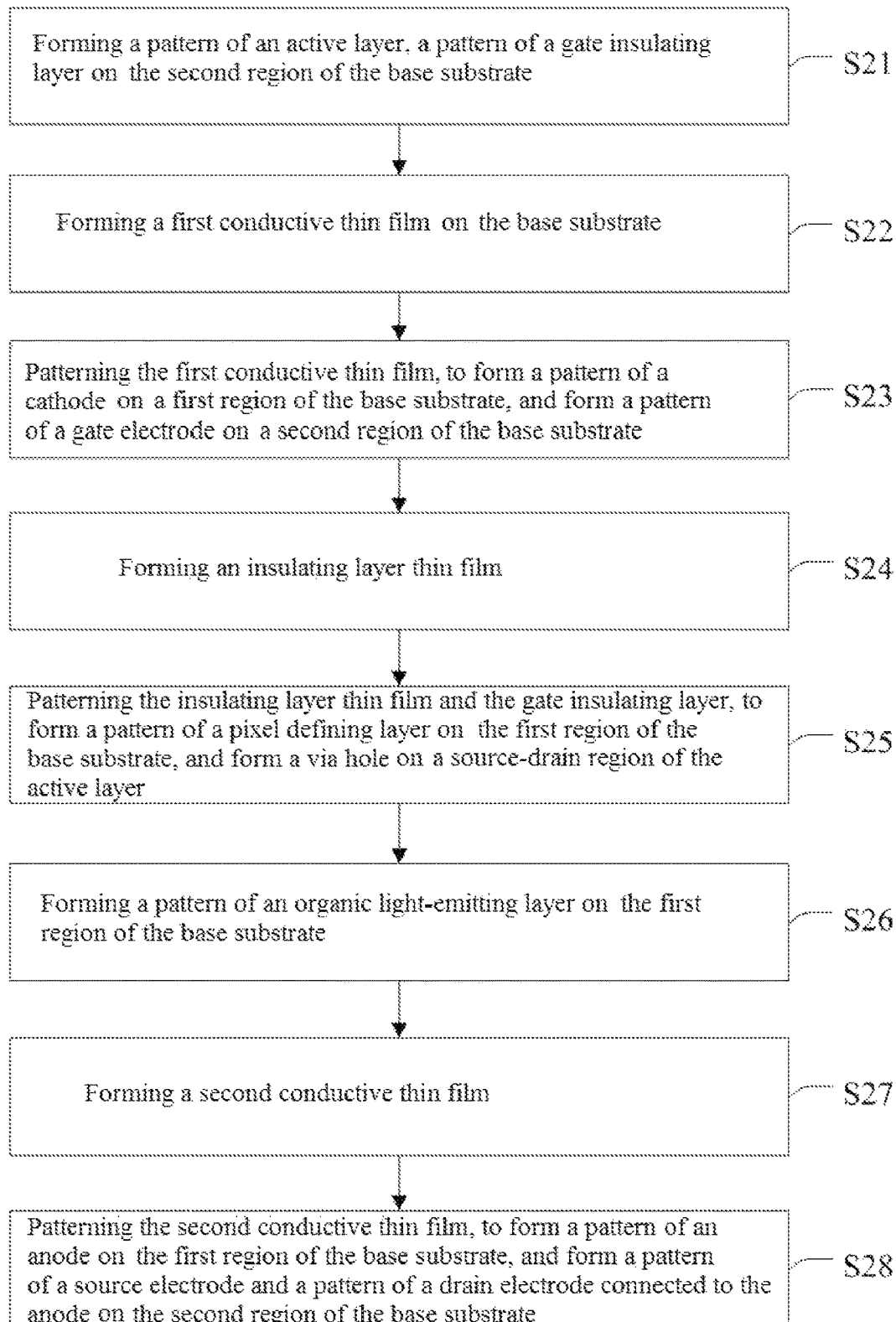
FIG. 3 is a flow chart of another manufacturing method of an array substrate provided by an embodiment of the present invention.
Figure 4:
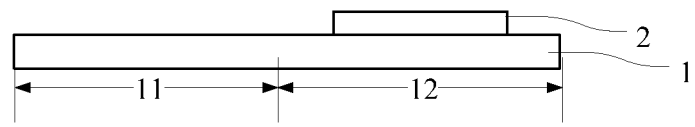
FIGS. 4 to 12 are schematic diagrams of fabricating an array substrate provided by the embodiment of the invention.
Figure 5:
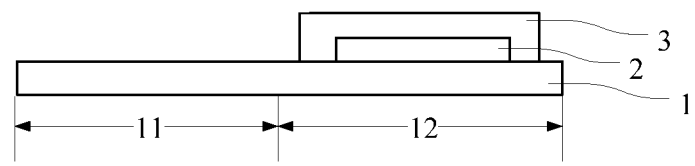
Figure 6:
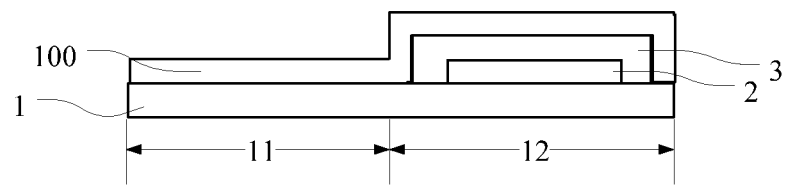
Figure 7:
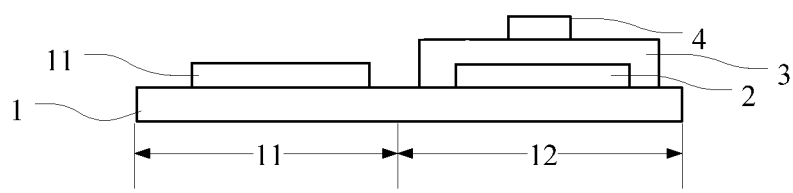
Figure 8:
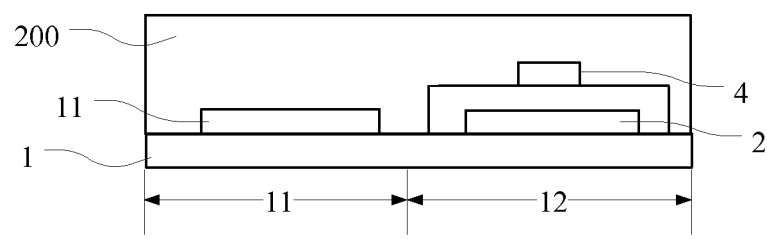
Figure 9:
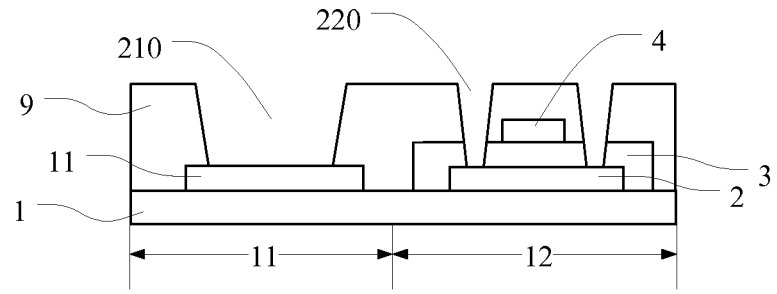
Figure 10:
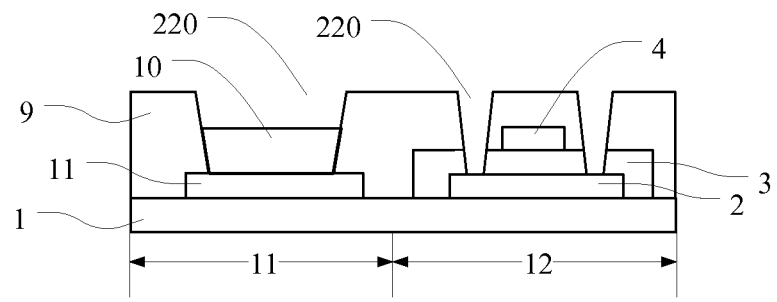
Figure 11:
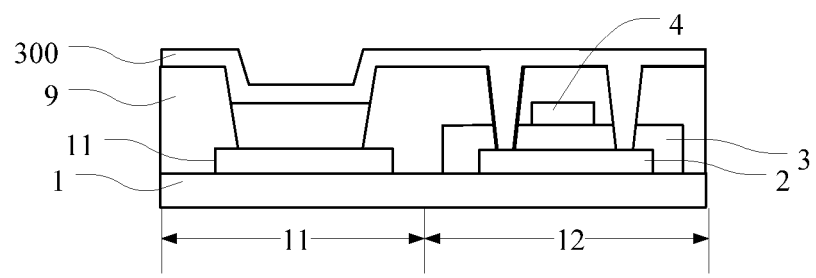
Figure 12:
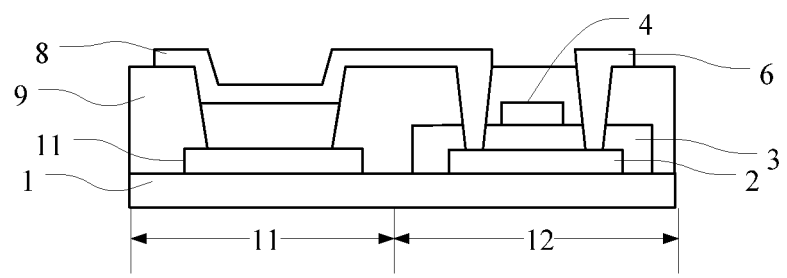

FIG. 3 is a flow chart of another manufacturing method of an array substrate provided by an embodiment of the present invention, and the manufacturing method comprises:

S21: forming a pattern of an active layer, a pattern of a gate insulating layer on a second region of the base substrate; with reference to FIG. 4 and FIG. 5, the base substrate 1 may be a transparent substrate such as a pre-washed glass substrate, an active layer 2 formed in the second region 12 may be a polycrystalline silicon layer, which is obtained by concerting an amorphous silicon layer by methods of excimer laser crystallization, metal induced crystallization and solid phase crystallization and so on. It should be noted that, specific processes and structures of the thin film transistors are varied due to different crystallization methods, and in a preparation process, it is needed to add processes such as heat treatment dehydrogenization, induced deposition of metal, heat treatment crystallization, excimer laser irradiating crystallization, doping in a source-drain region (P type or N type doping) and activation of the doped impurities according to conditions, but the present invention can also have the beneficial effects. For example, the active layer 2 has a thickness of 100 Å-3000 Å; in one example, the thickness is 500 Å-1000 Å. For example, the active layer 2 can be formed by PECVD, LPCVD or sputtering method, and a deposition temperature is below 600° C. The gate insulating layer 3 may be a single layer of silicon oxide, silicon nitride or a stacked layer of the two, and may be deposited by using methods of plasma enhanced chemical vapor-phase deposition (PECVD), low pressure chemical vapor-phase deposition (LPCVD), atmospheric pressure chemical vapor-phase deposition (APCVD) or electron cyclotron resonance chemical vapor-phase deposition (ECR-CVD), and the thickness is 500 Å-2000 Å. Appropriate thickness may be selected according to specific design needs, for example, a thickness of 600 Å-1500 Å;

S22: forming a first conductive thin film above the base substrate; with reference to FIG. 6, a first conductive thin film 100 may be of a structure of single layer, two layers or more than two layers, formed by a transparent conductive material, such as indium tin oxide, indium zinc oxide and so on, or formed by a metal, a metal alloy such as silver or silver alloy and the transparent conductive material formed above the metal, and may have a thickness in a range of 400 Å-6000 Å, for example, the thickness is 1500 Å-4000 Å, for forming a cathode layer of an organic light-emitting diode and a gate electrode layer of a thin film transistor;

S23: patterning the first conductive thin film; with reference to FIG. 7, a pattern of a cathode 11 is formed on a first region of the base substrate, and a pattern of a gate electrode 4 is formed on a second region of the base substrate;

S24: forming an insulating layer thin film; with reference to FIG. 8, the insulating layer thin film 200 may be made of an organic material, may adopt organic photoresist materials such as polyimide, acrylic and so on, and the thickness may be within 8000 Å-20000 Å;

S25: patterning the insulating layer thin film and the gate insulating layer, to form a pattern of a pixel defining layer on the first region of the base substrate, and form a via hole on a source-drain region of the active layer. For example, with reference to FIG. 9, the insulating layer thin film 200 is etched, to form a via hole 210 above the cathode layer 11 in the first region, form the pixel defining layer 9, and form a source-drain electrode via hole 220 above the source-drain region of the active layer, so that the patterned insulating layer thin film can be used as a pixel defining layer, further can be used as a planarization layer and an intermediate insulating layer;

S26: forming a pattern of an organic light-emitting layer on the first region of the base substrate; for example, with reference to FIG. 10, an organic light-emitting layer 10 is formed in a region of the via hole 210;

S27: forming a second conductive thin film; with reference to FIG. 11, the second conductive thin film 300 may be of a structure of single layer, two layers or more than two layers, and be in contact with the active layer 2 through the via hole 220; the second conductive thin film may be formed by a transparent conductive material, such as indium tin oxide, indium zinc oxide and so on, or formed by a metal, a metal alloy such as silver or silver alloy and the transparent conductive material formed above the metal, and may have a thickness in a range of 400 Å-6000 Å, in one example, the thickness is 1500 Å-4000 Å, for forming an anode layer of the organic light-emitting material and a source-drain electrode of the thin film transistor;

S28: patterning the second conductive thin film; with reference to FIG. 12, a pattern of an anode 8 is formed on the first region 11 of the base substrate, and a pattern of a source-drain electrode 6 is formed on the second region 12 of the base substrate, including a pattern of a source electrode and a pattern of a drain electrode connected to the anode 8. In the embodiment of the present invention, at least one of the first conductive thin film and the second conductive thin film is made of a transparent material, so that light emitted by EL part can irradiate out, for example, the first conductive thin film may be made of a metal material having a reflecting property, and the second conductive thin film may be made of a transparent metal material.

The manufacturing method of the array substrate provided by the embodiment of the present invention, as compared with the manufacturing method of an organic electroluminescent panel in the prior art, can greatly reduce complexity and process time of a fabrication process of an array substrate, simplify a fabrication process of an organic electroluminescent panel, and reduce production cost, by forming a cathode layer of an organic light-emitting diode and a gate electrode layer of a thin film transistor at the same time by the first patterning process, patterning the insulating layer thin film by the second time patterning process, wherein the patterned insulating layer thin film can be used as a pixel defining layer, further can be used as a planarization layer and an intermediate insulating layer, and forming an anode layer of the organic light-emitting diode and a source-drain electrode of the thin film transistor at the same time by the third time patterning process.

In addition, an embodiment of the present invention further provides an array substrate, comprising a plurality of pixel units arranged in a matrix on a base substrate, each of the pixel units including a thin film transistor structure, a cathode, an anode and an organic light-emitting layer between the cathode and the anode. The cathode is formed on a first region of the base substrate, a gate electrode of the thin film transistor structure is formed on a second region of the base substrate, and the cathode and the gate electrode of the thin film transistor structure are made of the same material and formed by one patterning process.

For example, in the array substrate described above, an active layer of the thin film transistor structure, and a gate insulating layer are formed below the gate electrode, each of the pixel units further includes a pixel defining layer formed above the cathode and a planarization layer formed above the gate electrode, and the pixel defining layer and the planarization layer are made of the same material and formed by one patterning process. For example, the pixel defining layer and the planarization layer are located in the same layer.

For example, in the array substrate described above, the organic light-emitting layer is formed on the cathode, the anode is formed on the organic light-emitting layer, a source electrode and a drain electrode of the thin film transistor structure are formed on the planarization layer, and the anode, the source electrode and the drain electrode are made of the same material and formed by one patterning process. For example, the anode, the source electrode and the drain electrode are located in the same layer.

According to the embodiments of the present invention, the first conductive thin film and the second conductive thin film may be a metal thin film made of a metal material, or made of a transparent conductive material such as a transparent metal oxide, or formed by stacking the metal material and the transparent metal oxide material. In the embodiments of the present invention, for outgoing of the light of the EL part, at least one of the first conductive thin film and the second conductive thin film is made of a transparent conductive material; in one example, the first conductive thin film is made of a material having a reflecting property, and the second conductive thin film is made of a transparent conductive material.

In addition, an embodiment of the present invention further provides a display device, comprising the array substrate described above. The display device provided by the embodiment of the invention may be a laptop display screen, a liquid crystal display, a liquid crystal television, a digital photo frame, a mobile phone, a tablet computer, or any other product or component having a display function.

The foregoing embodiments merely are exemplary embodiments of the disclosure, and not intended to define the scope of the disclosure, and the scope of the disclosure is determined by the appended claims.

The present application claims priority of Chinese Patent Application No. 201410602733.2 filed on Oct. 31, 2014, the disclosure of which is incorporated herein by reference in its entirety as part of the present application.

The invention claimed is:

1. A manufacturing method of an array substrate, comprising:
   forming a first conductive thin film having a single-layered structure on a base substrate; and
   patterning the first conductive thin film, to form a pattern of a cathode on a first region of the base substrate and form a pattern of an entire gate electrode on a second region of the base substrate, through a single patterning process from a same material,
   the manufacturing method further comprising:
   forming a pattern of an anode on the first region and a pattern of a source-drain electrode on the second region, at the same time, through a single patterning process from a same material.

2. The manufacturing method of the array substrate according to claim 1, further comprising: before forming the first conductive thin film on the base substrate,
   forming a pattern of an active layer, a pattern of a gate insulating layer on the second region of the base substrate.

3. The manufacturing method of the array substrate according to claim 2, further comprising: after patterning the first conductive thin film, to form the pattern of the cathode on the first region of the base substrate, and form the pattern of the gate electrode on the second region of the base substrate,
   forming an insulating layer thin film; and
   patterning the insulating layer thin film and the gate insulating layer, to form a pattern of a pixel defining layer on the first region of the base substrate, and form a via hole on a source-drain region of the active layer.

4. The manufacturing method of the array substrate according to claim 3, wherein, the insulating layer thin film has a thickness of 8000 Å-20000 Å.

5. The manufacturing method of the array substrate according to claim 3, further comprising: after patterning the insulating layer thin film and the gate insulating layer, to form the pattern of the pixel defining layer on the first region of the base substrate, and form the via hole on the source-drain region of the active layer,
   forming a pattern of an organic light-emitting layer on the first region of the base substrate;
   forming a second conductive thin film, the second conductive thin film being in contact with the active layer through the via hole; and
   patterning the second conductive thin film, to form a pattern of the anode on the first region of the base substrate, and form a pattern of the source electrode and a pattern of the drain electrode connected to the anode on the second region of the base substrate.

6. The manufacturing method of the array substrate according to claim 5, wherein, the second conductive thin film has a thickness of 1500 Å-4000 Å.

7. The manufacturing method of the array substrate according to claim 5, wherein, at least one of the first conductive thin film and the second conductive thin film is made of a transparent conductive material.

8. The manufacturing method of the array substrate according to claim 7, wherein, the first conductive thin film is made of a material having a reflecting property and the second conductive thin film is made of a transparent conductive material.

9. The manufacturing method of the array substrate according to claim 2, wherein, the first conductive thin film has a thickness of 1500 Å-4000 Å.

10. The manufacturing method of the array substrate according to claim 1, wherein, the first conductive thin film has a thickness of 1500 Å-4000 Å.

11. An array substrate, comprising a plurality of pixel units arranged in a matrix on a base substrate, each of the pixel units including a thin film transistor structure, a cathode, an anode and an organic light-emitting layer between the cathode and the anode, wherein, the cathode is formed on a first region of the base substrate, a gate electrode of the thin film transistor structure is formed on a second region of the base substrate, the cathode and the gate electrode of the thin film transistor structure are made of a same material and formed by a single patterning process, and
   the anode as well as a source electrode and a drain electrode of the thin film transistor structure are made of a same material and formed by a single patterning process.

12. The array substrate according to claim 11, wherein, the cathode and the gate electrode of the thin film transistor structure are located in a same layer.

13. The array substrate according to claim 11, wherein, an active layer of the thin film transistor structure, and a gate insulating layer are formed below the gate electrode, each of the pixel units further includes a pixel defining layer formed on the cathode and a planarization layer formed on the gate electrode, and the pixel defining layer and the planarization layer are made of a same material and formed by one patterning process.

14. The array substrate according to claim 13, wherein, the pixel defining layer and the planarization layer are located in a same layer.

15. The array substrate according to claim 11, wherein, the organic light-emitting layer is formed on the cathode, the anode is formed on the organic light-emitting layer, a source electrode and a drain electrode of the thin film transistor structure are formed on the planarization layer, and the anode, the source electrode and the drain electrode are made of a same material and formed by one patterning process.

16. A display device, comprising the array substrate according to claim 11.

17. The display device according to claim 16, wherein, the cathode and the gate electrode of the thin film transistor structure are located in a same layer.

18. The display device according to claim 16, wherein, an active layer of the thin film transistor structure, and a gate insulating layer are formed below the gate electrode, each of the pixel units further includes a pixel defining layer formed on the cathode and a planarization layer formed on the gate electrode, and the pixel defining layer and the planarization layer are made of a same material and formed by one patterning process.

19. The display device according to claim 18, wherein, the pixel defining layer and the planarization layer are located in a same layer.

20. The display device according to claim 16, wherein, the organic light-emitting layer is formed on the cathode, the anode is formed on the organic light-emitting layer, a source electrode and a drain electrode of the thin film transistor structure are formed on the planarization layer, and the anode, the source electrode and the drain electrode are made of a same material and formed by one patterning process.

* * * * *